United States Patent Office 3,020,409

Patented Feb. 6, 1962

3,020,409

METHOD OF SORTING-OUT PARTS OF INSULATING MATERIAL

Wolfgang Clement, Stuttgart-Zuffenhausen, Germany, assignor to International Standard Electric Corporation, New York, N.Y., a corporation of Delaware No Drawing. Filed July 7, 1959, Ser. No. 825,400
Claims priority, application Germany July 16, 1958
5 Claims. (Cl. 250—106)

The present invention is in particular concerned with the manufacture of parts of insulating material carrying lines and/or circuit elements, such as the so-called printed circuits for electric and, in particular, electronic circuit arrangements. These parts of insulating material, which are hereinafter also referred to as circuit plates, consist of a base plate of insulating material and of line conductors arranged on this plate. These line conductors are relatively very broad, but very thin when compared with the conventional wirings of the usual types of round copper wires. The thin line conductors of the printed circuits adhere to the base plate e.g. by means of adhesive agents, such as adhesive or binding materials, adhesive foils, or the like.

The printed circuit technique has become of a substantial importance especially in manufacturing such circuit plates in mass production, such as in the radio manufacturing industry. These printed circuits replace the conventional and very time-consuming method of the manual wiring and soldering of the connecting points. Once the circuit is laid down graphically it can then be chemographically reproduced by mass production, similar to the method of manufacturing stereotype plates for copperplate printing. Furthermore the method of manufacturing the printed circuits permits a very compact arrangement of the electrical circuit components on the base plate, because the minimum distances between the line conductors which are actually of the metallic bare type, are exactly defined, and are not subjected to an alteration during the reproduction. These various advantages have contributed towards the importance of the printed circuits in the electro-technical art.

Such a printed circuit is generally manufactured by coating the case plate of insulating material with a thin foil of copper. An adhesive material between the base plate and the copper foil serves to cement the metal foil and the base plate firmly with each other. On the copper foil there is arranged a photo-sensitive layer, e.g. of chrome gelatine, whose positions which are exposed parts of this layer, drawn in the shape of a negative of a circuit diagram, lose the property of solubility, whereas the non-exposed portions remain soluble. The soluble parts of the photo-sensitive layer are washed out, exposing those portions of the surface of the copper foil which are not to be conductors in the printed circuit. The "naked" surfaces of the metal foil are then removed by a chemical etching process, or by electrolytical removal. Thereupon the finished circuit plates are carefully neutralized and washed, to remove traces of the conductive substances reducing the insulation ability of the base plate, which are likely to adhere on the exposed base plate or between the base plate and the copper foil inside capillary cavities.

The electrical quality, such as the insulation resistance from line conductor to line conductor, of printed circuits manufactured this way is sufficient for most purposes. Such circuits may be satisfactory for commercial types of radio and television receivers. However, the employment of these types of printed circuits with high-quality apparatus entails difficulties caused by a doubtful insulation between the various line conductors. These difficulties are of importance in apparatus used in the high-frequency measuring field as well as in the data transmission field.

Such apparatus may be operated in postal administration systems, or on marine vessels and have to meet particular requirements with respect to the insulation resistance and its constancy throughout many years. Also under the influence of considerable humidity and temperature variations. Despite of the careful washing of the finished printed circuits after leaving the various chemical baths the removal of the electrolyte, or remainders of ions is not reliable to the extent necessary for such high-quality apparatus. Thus, there may appear costly failure of component parts of the apparatus, because the deficiencies of the insulation only appear and are recognizable a long time after putting the apparatus into operation, exposed to atmospheric influences, such as high humidity of the air.

Many efforts have been made to avoid these difficulties in manufacturing such circuit plates without using chemical baths. Screen printing on a base of insulating material has been tried, but this is only possible with relatively rough circuit arrangements and only a very poor adherence is obtained. A similar effect has been achieved by the spraying of metal with the aid of a metal spray gun and by means of a template corresponding to the shape of the circuit scheme. The relatively coarse conductors and the inconstant conductance make these methods only suitable for circuit arrangements of a subordinated type.

The objections to the use of electrolyte etching baths or other galvanic treatment in the manufacture of printed circuits for high-quality apparatus even led to abandonment of the conventional printing and etching technique. Attempts were made to replacing an etching process by the mechanical milling of metal foil from the surface areas. This, however, slows the mass production and does also not permit a compact arrangement of the conductors. To avoid electrolytes completely in cases where high demands are placed on the insulation ability manufacturers have started to again use individual conductors, e.g. in the form of round or flat wires. In view of the large numbers to be manufactured, such wires are provided with certain specified shapes serving the mounting purpose, for anchoring them in the base plate which has been previously perforated in accordance with the circuit scheme. Although this method requires arrangements for providing the plates with the necessary holes, for preshaping the wires, and for inserting them in the plates, it is still preferred in the interest of the reliability and unchangeability of an originally existing high insulation resistance, instead of the much more rationalized manufacture of the printed circuits in accordance with the etching method which is already used and known since about 30 years.

To enable the manufacture of circuit plates of a very high quality by the well-known etching method for printed circuits, but avoiding the aforementioned difficulties, the present invention provides a method of detecting plates which are not free of electrolytes or other chemicals which may reduce the insulation properties. These plates may be removed and again washed or otherwise treated to restore the high electrical insulation ability of the insulation materials. The method is characterized in that radioactive atoms or substances are mixed with or are chemically bound with the manufacturing fluids.

The radioactive rays from the remainders of the mixture of the manufacturing fluids left on the insulating material after treatment are recognizable via a radiation receiver. Actuating arrangements controlled by the receiver may initiate an appropriate automatic sorting-out and/or further washing process, or other treatment.

During the manufacture of printed circuits according to the etching method there is used e.g. a ferric-chloride solution for etching the copper foil. There exists the danger that remainders of the ferric-chloride solution ($FeCl_3$) are not completely washed out of the plate of insulating material. This will cause deficiencies of the insulation which will only become noticeable much later, e.g. subsequently to the insertion of the circuit elements. It is possible to measure the insufficient insulation value directly after the manufacturing process by which the electrolyte is supposed to be removed, that is, after the washing process. To do this, however, the printed circuits must first be completely dried. However, this drying is relatively difficult to perform because the molecules of the washing liquid penetrate deeply into the submicroscopic cavities of the base plate containing the filling agents. Moreover, this drying takes a relatively long time and requires increased temperatures for diffusing all remainders of the washing liquid out of the base plate. Also depending on the necessary testing conditions, there must be provided the defined conditions of humidity conventional for the testing of the insulation.

When these manufacturing fluids which reduce the insulation ability of the insulating materials, such as the etching liquid, ferric chlorides for printed circuit plates, contain a tracer isotope, then those of the circuit plates on which insulation difficulties are later on to be expected, may be sorted out immediately after the stage of treatment serving the complete removal thereof, e.g. by washing. In other words the sorting-out from those circuit plates which are sufficiently freed from the manufacturing fluid can be performed when still in the wet condition. Thus for instance the ferric chloride solution serving e.g. the etching of a printed circuit, may contain small and doped amounts of a tracer iron isotope $Fe^{55}$.

The iron isotope $Fe^{55}$ has a half life of 2.94 years, so that a measuring-technical utilization of its radiation is possible throughout a long period of time without causing faulty measurement. For the permanent use of such radioactive isotopes there are particularly suitable the isotopes radiating the beta-rays rather than the isotopes emitting the very hard and dangerous gamma-rays. Furthermore there may be used e.g. the beta-radiators $Cl^{36}$ in muriatic acid (HCl) with a half life of $4.10^5$a and $Ca^{45}$ as calcium chloride ($CaCl_2$) with a half life of 152 d.

The isotopes can be added or admixed to the manufacturing fluids or agents, by which there are supposed to be understood also the solutions thereof, either alone or chemically bound to other substances at least not detrimentally affecting the purpose of the manufacture. However, the isotopes may also be chemically inserted into the molecule of the actual etching substance, that is by way of synthesis, which may be of advantage in some cases. Of a substantial importance is the good dispersing ability within the manufacturing agent.

Particularly suitable are such substances which are consumed during the etching process in the etching bath. Accordingly, to the etching agent for copper which is mostly used, that is, ferric-chloride solution, there may be added e.g. the radioactive chloride isotope $Cl^{36}$ in the form of $HCl^{36}$. As one example of the possible chemical insertion, especially the radioactive iron isotope $Fe^{55}$ according to the formula $$Fe^{55}+3HCl=Fe^{55}Cl_3+1\tfrac{1}{2}H_2$$

or the chloride isotope $Cl^{36}$ according to the formula $$Fe+3HCl^{36}=Fe(Cl^{36})_3+1\tfrac{1}{2}H_2$$

can be bound.

After the finished printed circuits, on which the remainders of the etching agent have been washed away as well as possible, leave the washing arrangement, they are led in the still wet state through a radiation measuring position which is equipped with suitable measuring instruments, such as the Geiger-Müller-Counter or the scintillation counter. These measuring instruments indicate the passage of those printed circuits still containing dangerous remainders of the etching agent in the structure of the base plate or in the smallest cavities in or on the copper coating. In addition thereto these measuring instruments may initiate the sorting out of such circuit plates and control, if so required, the further treatment adapted to increase the insulation ability.

When employing the inventive method, the electrical measurements for determining the quality of insulation of the printed circuits are practically rendered superfluous, because the plates of insulating material which are nowadays used as base plates for particularly high-quality apparatus, are commercially available with a very high electrical quality. For this reason the high electrical quality desirable after the etching process, or existing prior to the etching process, is ensured merely by means of this method directed to the removal of the insulation parts or to circuit plates with a reduced insulation. In this way the conventional and advantageous method of producing printed circuits can be made again accessible and useful also for the manufacture of apparatus which were hitherto only capable of meeting the particularly high requirements with respect to a permanent reliability by avoiding an etching process or an electrolytical treatment, but by employing a relatively expensive method of manufacture.

The metal which is chemically disintegrated by means of such etching or galvanical abrasion methods, i.e. in the case of the printed circuit, the copper of the copper foil attached to the plate of insulating material, is generally not recovered because of the relatively high expenses. However, its recovery is substantially more economical with the method according to the invention, because the regeneration of the metal, that is, of the copper in the case of printed circuits, simultaneously represents a recovery of the remaining radioactive manufacturing agents which are used for the etching or for the galvanical abrasion. For reasons of the unwanted waste enrichment, and in view of the costs, the radioactive isotopes, in the course of the circulation, can be just as well reused as the copper.

The danger of radiation due to the use of pure beta-rays is an extremely low one, so that radiation protection measures only need to be taken to a small extent. Furthermore, also the removal of the radioactive waste products, accruing with the inventive method to a small extent, is not entailed by any difficulties because they, correspondingly diluted, can be unobjectionably led into the sewer system without reaching the highest admissible radiation limit as prescribed by the competent authorities. It may also be regarded as an advantage of the inventive method that the portion of the radioactive solution may be extremely small with respect to the total solution, because the tracing sensitivity of the measuring instruments can be practically increased at will.

While the principles of this invention have been described in connection with a specific method, it is to be clearly understood that this description is made only by way of example and not as a limitation to the scope of the invention as set forth in the objects thereof and in the accompanying claims.

What is claimed is:

1. A method of detecting plastic components having etched conductive elements thereon which contain remnants of the etching agent, which will ultimately reduce the insulating property of the plastic, in which the etching agent is a compound comprising introducing into the etching agent portions of substantially the same compound in which one of the elements of the compound is radioactive, etching the components in said agent, cleaning said etching components, and thereafter testing said cleaned components for radioactivity, to detect components having a residual remnant of said etching agent.

2. A method as claimed in claim 1 wherein said manufacturing agent comprises the etching agent ferric chloride ($FeCl_3$), and said introduced portion includes a radio active component of iron or chlorine.

3. A method as claimed in claim 2, wherein said radioactive element is the radioactive iron isotope $Fe^{55}$ and wherein said substance is incorporated in accordance with the formula:

$$Fe^{55}+3HCl=Fe^{55}Cl_3+1\frac{1}{2}H_2$$

4. A method as claimed in claim 2 wherein said radioactive element is the chloride isotope $Cl^{36}$ and wherein said substance is incorporated in accordance with the formula:

$$Fe+3HCl^{36}=Fe(Cl^{36})_3+1\frac{1}{2}H_2$$

5. A method as claimed in claim 1, wherein the manufacturing agent is an etching agent which chemically disintegrates metal, further comprising continuously removing from the etching solution the disintegrated metal, and reusing the remaining etching solution with the incorporated radioactive substance.

References Cited in the file of this patent

UNITED STATES PATENTS

| | | |
|---|---|---|
| 2,680,900 | Linderman | June 15, 1954 |
| 2,811,650 | Wagner | Oct. 29, 1957 |
| 2,904,693 | Miller | Sept. 15, 1959 |